(12) United States Patent
Chan et al.

(10) Patent No.: US 8,502,370 B2
(45) Date of Patent: Aug. 6, 2013

(54) STACK PACKAGE STRUCTURE AND FABRICATION METHOD THEREOF

(75) Inventors: Ying-Chih Chan, Taoyuan (TW); Jiun-Ting Lin, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 0 days.

(21) Appl. No.: 13/572,866

(22) Filed: Aug. 13, 2012

(65) Prior Publication Data
US 2013/0147041 A1 Jun. 13, 2013

(30) Foreign Application Priority Data
Dec. 8, 2011 (TW) ............................. 100145416 A

(51) Int. Cl.
*H01L 23/02* (2006.01)
(52) U.S. Cl.
USPC ............ 257/686; 257/E25.006; 257/E25.021; 257/E25.027; 257/E23.085; 257/777; 438/109
(58) Field of Classification Search
USPC .................. 257/686, 777, E25.006, E25.021, 257/E25.027, E23.085; 438/109, FOR. 368, 438/FOR. 426
See application file for complete search history.

(56) References Cited

U.S. PATENT DOCUMENTS

| 7,652,361 | B1 * | 1/2010 | Yoshida et al. | 257/686 |
| 8,106,495 | B2 * | 1/2012 | Kajiki | 257/678 |
| 2006/0278968 | A1 * | 12/2006 | Yamano | 257/686 |
| 2008/0017968 | A1 * | 1/2008 | Choi et al. | 257/686 |

* cited by examiner

*Primary Examiner* — Jasmine Clark
(74) *Attorney, Agent, or Firm* — Edwards Wildman Palmer LLP; Peter F. Corless; Steven M. Jensen

(57) ABSTRACT

A stack package structure is provided, including: a substrate; an insulating layer formed on the substrate and having openings for exposing die attach pads and conductive pads of the substrate, respectively; a plurality of first and second conductive terminals formed on the insulating layer and electrically connected to the die attach pads and the conductive pads, respectively; a dielectric layer formed on the insulating layer and having a cavity for exposing the first conductive terminals and a plurality of openings exposing the second conductive terminals; copper pillars formed respectively in the openings of the dielectric layer; a semiconductor chip disposed in the cavity and electrically connected to the first conductive terminals; solder balls formed respectively on the copper pillars that are located proximate to the die attach area; and a package structure disposed on and electrically connected to the solder balls.

20 Claims, 4 Drawing Sheets

STACK PACKAGE STRUCTURE AND FABRICATION METHOD THEREOF

CROSS-REFERENCES TO RELATED APPLICATIONS

This application claims under 35 U.S.C. §119(a) the benefit of Taiwanese Application No. 100145416, filed Dec. 8, 2011, the entire contents of which is incorporated herein by reference.

BACKGROUND OF THE INVENTION

1. Field of the Invention

The present invention relates to stack package structures and fabrication methods thereof, and, more particularly, to a stack package structure having copper pillars and a fabrication method thereof.

2. Description of Related Art

Along with the miniaturization of electronic products, less area is available on packaging substrates for disposing semiconductor chips or package structures. Accordingly, vertical stacking technologies have been developed to provide stack package structures. A plurality of solder balls are disposed on a package structure so as for another package structure to be stacked thereon, thus forming a package-on-package (PoP) structure that meets the requirement of high component density on a small bonding area.

FIGS. 1A to 1E are schematic cross-sectional views showing a conventional stack package structure and a fabrication method thereof.

Referring to FIG. 1A, a substrate 10 is provided. A surface 101 of the substrate 10 has a plurality of die attach pads 11 and a plurality of conductive pads 12 disposed around the die attach pads 11. An insulating layer 13 is formed on the surface 101 of the substrate 10 and has a plurality of openings 130 for exposing the die attach pads 11 and the conductive pads 12. A plurality of first solder balls 14 are disposed on the die attach pads 11.

Referring to FIG. 1B, a semiconductor chip 15 is disposed on the first solder balls 14.

Referring to FIG. 1C, an encapsulant 16 is formed on the substrate 10 to encapsulate the semiconductor chip 15.

Referring to FIG. 1D, a plurality of second solder balls 17 are disposed on the conductive pads 12.

Referring to FIG. 1E, a package structure 18 is disposed on the second solder balls 17, thus forming a PoP package structure.

In the above-described PoP package structure, the second solder balls 17 on the conductive pads 12 must have a large size so as to prevent the package structure 18 from coming into contact with the semiconductor chip 15. The large-size solder balls occupy much area of the substrate and increase the thickness of the overall package structure, thereby adversely affecting the miniaturization of electronic products.

Therefore, there is a need to provide a stack package structure and a fabrication method thereof so as to overcome the above-described drawbacks.

SUMMARY OF THE INVENTION

In view of the above-described drawbacks, the present invention provides a stack package structure, which comprises: a first substrate having a first surface with a die attach area and a peripheral area defined thereon and a second surface opposite to the first surface, wherein the die attach area has a plurality of die attach pads, and the peripheral area has a plurality of first conductive pads; a first insulating layer formed on the first surface of the first substrate and having a plurality of openings for exposing the die attach pads and the first conductive pads, respectively; a plurality of first conductive terminals and a plurality of second conductive terminals formed on the first insulating layer and electrically connected to the die attach pads and the first conductive pads, respectively; a dielectric layer formed on the first insulating layer and having a cavity corresponding in position to the die attach area to expose the first conductive terminals and a plurality of openings for exposing the second conductive terminals; a plurality of first copper pillars formed respectively on the second conductive terminals in the openings of the dielectric layer; a first semiconductor chip disposed in the cavity of the dielectric layer and electrically connected to the first conductive terminals; a plurality of first solder balls formed respectively on the first copper pillars that are located proximate to the die attach area; and a first package structure disposed on and electrically connected to the first solder balls.

The above-described structure can further comprise a plurality of second copper pillars formed respectively on the first copper pillars that are located distant from the die attach area; a plurality of second solder balls formed respectively on the second copper pillars; and a second package structure disposed on and electrically connected to the second solder balls.

The present invention further provides a fabrication method of a stack package structure, which comprises the steps of: providing a first substrate having a first surface with a die attach area and a peripheral area defined thereon and a second surface opposite to the first surface, wherein the die attach area has a plurality of die attach pads, and the peripheral area has a plurality of first conductive pads; forming a first insulating layer on the first surface of the first substrate and forming a plurality of openings in the first insulating layer for exposing the die attach pads and the first conductive pads, respectively; forming on the first insulating layer a plurality of first conductive terminals and a plurality of second conductive terminals electrically connected to the die attach pads and the first conductive pads, respectively; forming a dielectric layer on the first insulating layer and forming in the dielectric layer a cavity corresponding in position to the die attach area to expose the first conductive terminals and a plurality of openings for exposing the second conductive terminals; forming a plurality of first copper pillars on the second conductive terminals in the openings of the dielectric layer, respectively; disposing a first semiconductor chip in the cavity of the dielectric layer and electrically connecting the first semiconductor chip and the first conductive terminals; forming a plurality of first solder balls respectively on the first copper pillars that are located proximate to the die attach area; and disposing and electrically connecting a first package structure to the first solder balls.

The method can further comprise: after forming the first copper pillars, forming a plurality of second copper pillars respectively on the first copper pillars that are located distant from the die attach area; and, after disposing the first package structure, forming a plurality of second solder balls respectively on the second copper pillars so as to dispose and electrically connect a second package structure to the second solder balls.

Therefore, by disposing a semiconductor chip in a cavity of a dielectric layer and disposing package structures on copper pillars of different heights, the present invention effectively reduces the size of solder balls between the package structures and the copper pillars and also effectively reduces the planar size and thickness of the overall structure. Further, the copper pillars can be formed through stencil printing so as to achieve high yield, fine pitch and high uniformity.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "on," "around," "side" etc. are merely for illustrative purpose and should not be construed to limit the scope of the present invention.

FIGS. 2A to 2J are schematic cross-sectional views showing a stack package structure and a fabrication method thereof according to the present invention.

Figure 1A:
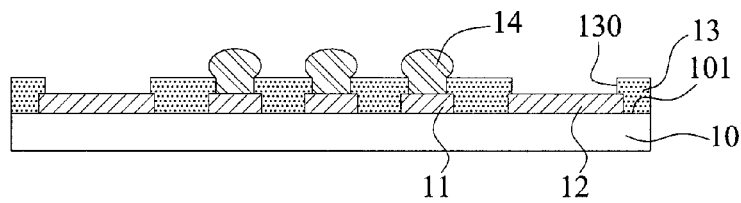
FIGS. 1A to 1E are schematic cross-sectional views showing a conventional stack package structure and a fabrication method thereof.
Figure 1B:
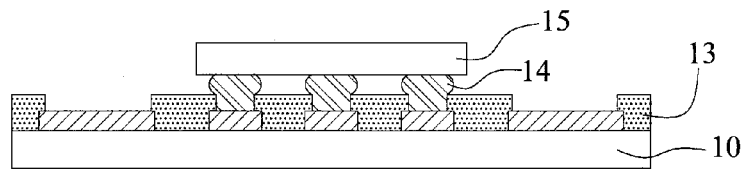
Figure 1C:
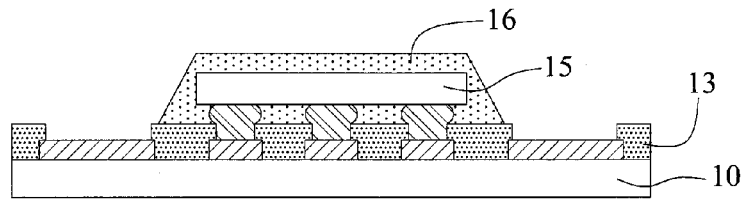
Figure 1D:
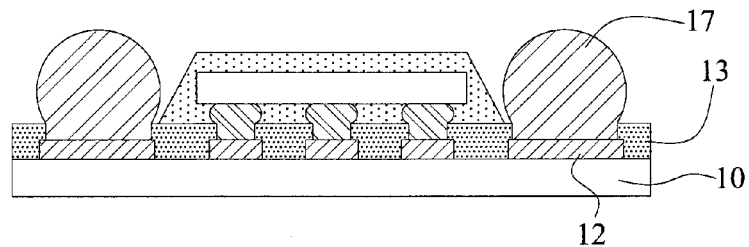
Figure 1E:
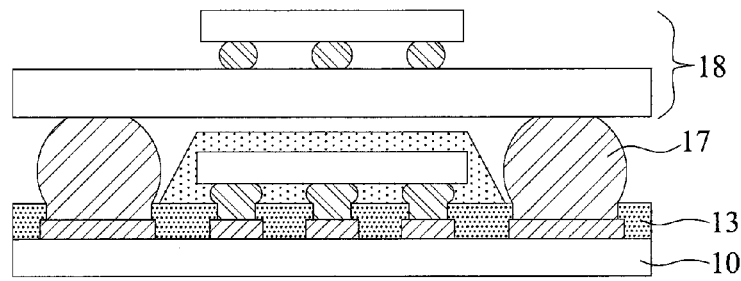
Figure 2A:
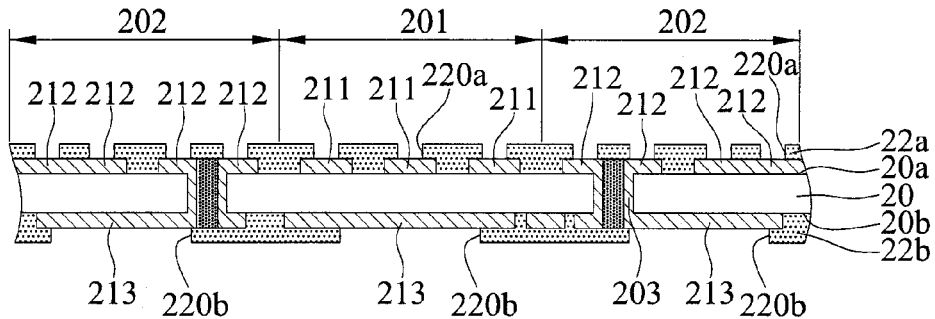
FIGS. 2A to 2J are schematic cross-sectional views showing a stack package structure and a fabrication method thereof according to the present invention.

Referring to FIG. 2A, a first substrate 20 is provided, which has a first surface 20a with a die attach area 201 and a peripheral area 202 defined thereon and a second surface 20b opposite to the first surface 20a. The die attach area 201 has a plurality of die attach pads 211, and the peripheral area 202 has a plurality of first conductive pads 212. A first insulating layer 22a is formed on the first surface 20a and has a plurality of openings 220a for exposing the die attach pads 211 and the first conductive pads 212, respectively. The second surface 20b has a plurality of second conductive pads 213, and a second insulating layer 22b is formed on the second surface 20b and has a plurality of openings 220b for exposing the second conductive pads 213, respectively. The first substrate 20 further has a plurality of conductive through holes 203 penetrating the first and second surfaces 20a, 20b and electrically connected to the die attach pads 211, the first conductive pads 212 and the second conductive pads 213.

Figure 2B:
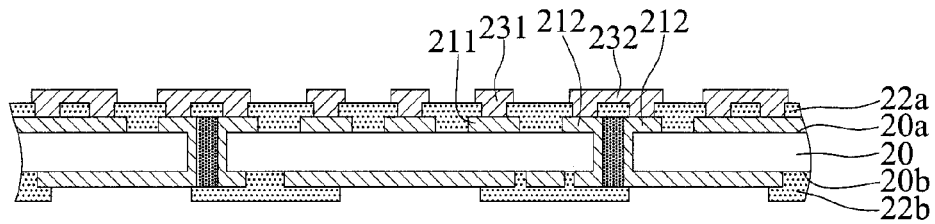

Referring to FIG. 2B, a plurality of first conductive terminal 231 and a plurality of second conductive terminals 232 are formed on the first insulating layer 22a and electrically connected to the die attach pads 211 and the first conductive pads 212, respectively.

Figure 2C:
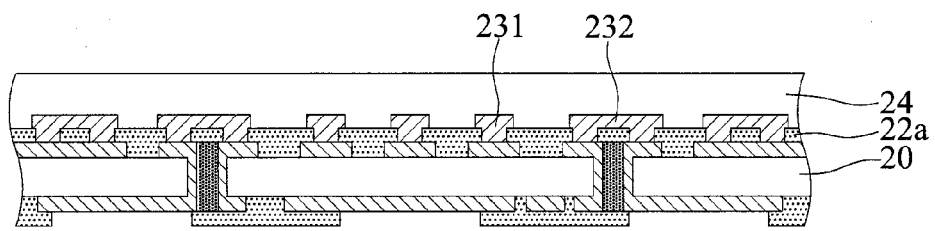

Referring to FIG. 2C, a dielectric layer 24 is formed on the first insulating layer 22a. The dielectric layer 24 is made of a photosensitive material.

Figure 2D:
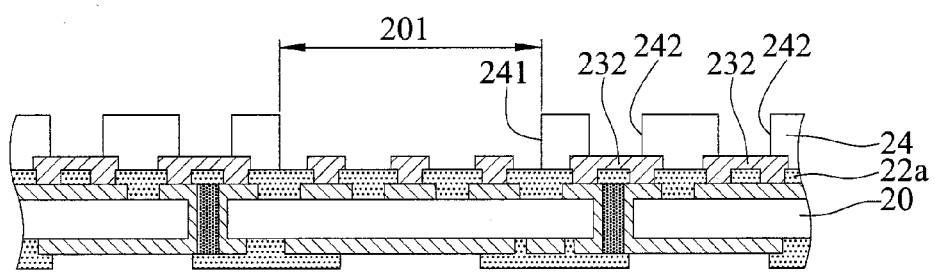

Referring to FIG. 2D, a cavity 241 is formed in the dielectric layer 24 corresponding in position to the die attach area 201 to expose the first conductive terminals 231, and a plurality of openings 242 are formed in the dielectric layer 24 for exposing the second conductive terminals 232, respectively.

Figure 2E:
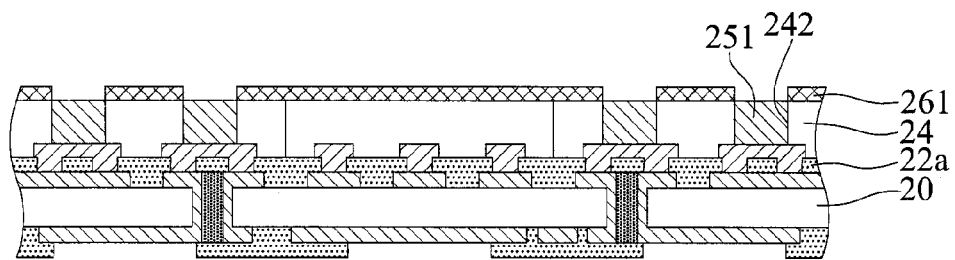

Referring to FIG. 2E, a plurality of first copper pillars 251 are formed respectively on the second conductive terminals 232 in the openings 242 of the dielectric layer 24 through a stencil printing process with the use of a stencil 261.

Figure 2F:
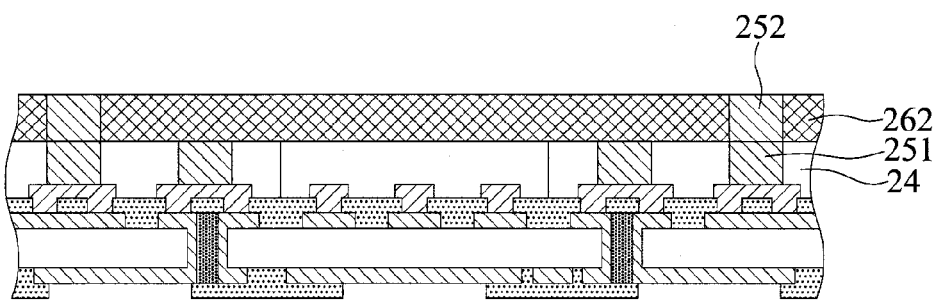

Referring to FIG. 2F, a plurality of second copper pillars 252 are formed on the first copper pillars 251 that are located distant from the die attach area 201 through a stencil printing process with the use of a stencil 262.

Figure 2G:
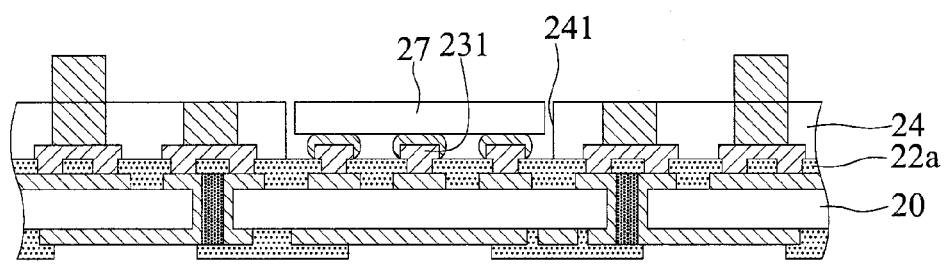

Referring to FIG. 2G, a first semiconductor chip 27 is disposed in the cavity 241 of the dielectric layer 24 and electrically connected to the first conductive terminals 231.

Figure 2H:
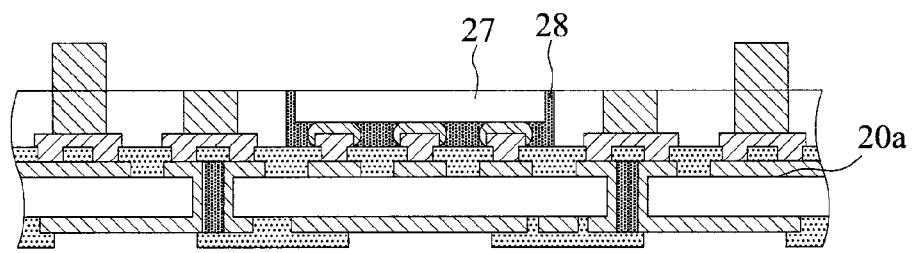

Referring to FIG. 2H, an underfill 28 or an encapsulant is formed between the first semiconductor chip 27 and the first surface 20a of the first substrate 20.

Figure 2I:
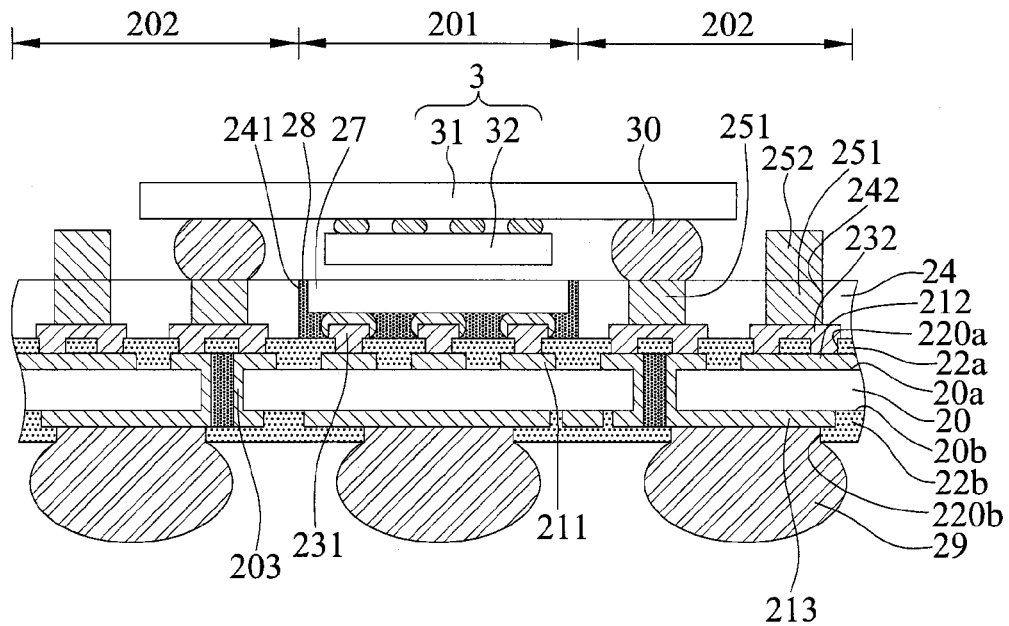

Referring to FIG. 2I, a plurality of first solder balls 30 are formed on the first copper pillars 251 that are located proximate to the die attach area 201, and a first package structure 3 is disposed on and electrically connected to the first solder balls 30. The first package structure 3 has a second substrate 31 and a second semiconductor chip 32 disposed on the second substrate 31 in a flip-chip manner. The first package structure 3 is disposed in a manner that the second semiconductor chip 32 is located between the second substrate 31 and the dielectric layer 24. Further, a plurality of solder bumps 29 are formed on the second conductive pads 213, respectively.

Figure 2J:
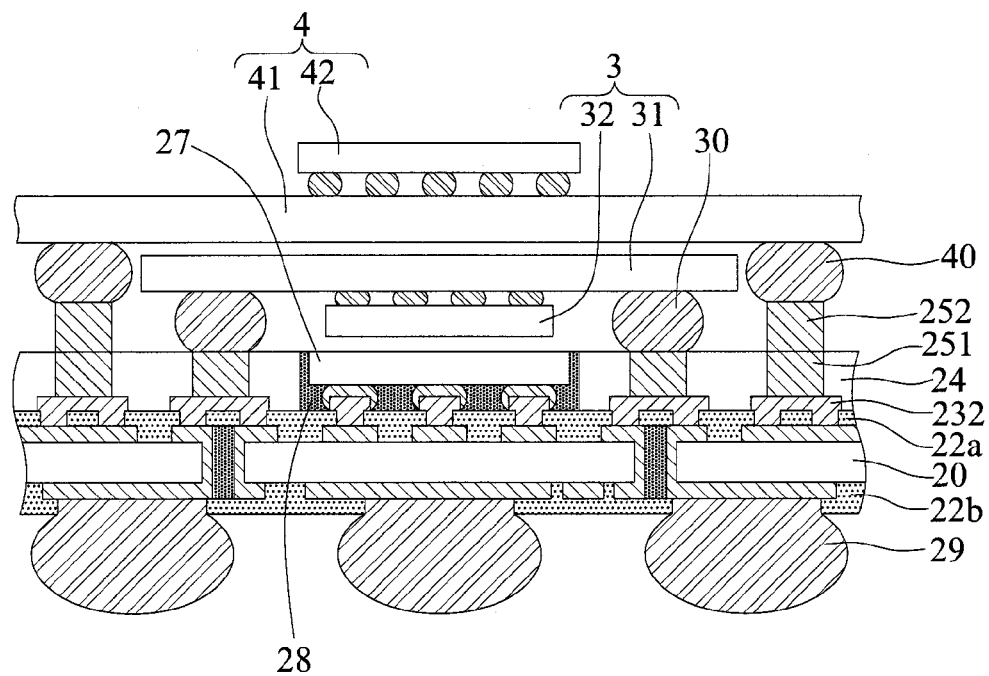

Referring to FIG. 2J, a plurality of second solder balls 40 are formed on the second copper pillars 252, respectively, and a second package structure 4 is disposed on and electrically connected to the second solder balls 40. The second package structure 4 has a third substrate 41 and a third semiconductor chip 42 disposed on the third substrate 41 in a flip-chip manner. The second package structure 4 is disposed in a manner that the third substrate 41 is located between the third semiconductor chip 42 and the second substrate 31.

The present invention further provides a stack package structure, which has: a first substrate 20 having a first surface 20a a with a die attach area 201 and a peripheral area 202 defined thereon and a second surface 20b opposite to the first surface 20a, wherein the die attach area 201 has a plurality of die attach pads 211, and the peripheral area 202 has a plurality of first conductive pads 212; a first insulating layer 22a formed on the first surface 20a of the first substrate 20 and having a plurality of openings 220a for exposing the die attach pads 211 and the first conductive pads 212, respectively; a plurality of first conductive terminals 231 and a plurality of second conductive terminals 232 formed on the first insulating layer 22a and electrically connected to the die attach pads 211 and the first conductive pads 212, respectively; a dielectric layer 24 formed on the first insulating layer 22a and having a cavity 241 corresponding in position to the die attach area 201 to expose the first conductive terminals 231 and a plurality of openings 242 for exposing the second conductive terminals 232; a plurality of first copper pillars 251 formed respectively on the second conductive terminals 232 in the openings 242 of the dielectric layer 24; a first semiconductor chip 27 disposed in the cavity 241 of the dielectric layer 24 and electrically connected to the first conductive terminals 231; a plurality of first solder balls 30 formed respectively on the first copper pillars 251 that are located proximate to the die attach area 201; and a first package structure 3 disposed on and electrically connected to the first solder balls 30.

In the above-described stack package structure, the first package structure 3 has a second substrate 31 and a second semiconductor chip 32 disposed on the second substrate 31 in a flip-chip manner. The first package structure 3 is disposed in a manner that the second semiconductor chip 32 is located between the second substrate 31 and the dielectric layer 24.

The stack package structure further has: a plurality of second copper pillars 252 formed respectively on the first copper pillars 251 that are located distant from the die attach area 201, a plurality of second solder balls 40 formed respectively on the second copper pillars 252, and a second package structure 4 disposed on and electrically connected to the second solder balls 40.

The second package structure 4 has a third substrate 41 and a third semiconductor chip 42 disposed on the third substrate 41 in a flip-chip manner. The second package structure 4 is disposed in a manner that the third substrate 41 is located between the third semiconductor chip 42 and the second substrate 31.

In the above-described stack package structure, the second surface 20b of the first substrate 20 has a plurality of second conductive pads 213. A second insulating layer 22b is formed on the second surface 20b and has a plurality of openings 220b for exposing the second conductive pads 213, respectively.

Further, the first substrate 20 has a plurality of conductive through holes 203 penetrating the first surface 20a and the second surface 20b and electrically connected to the die attach pads 211, the first conductive pads 212 and the second conductive pads 213.

The above-described stack package structure further has a plurality of solder bumps 29 formed on the second conductive pads 213, respectively; and an underfill 28 or an encapsulant formed between the first semiconductor chip 27 and the first surface 20a of the first substrate 20.

Therefore, by disposing a semiconductor chip in a cavity of a dielectric layer and disposing a plurality of package structures on copper pillars of different heights, the present invention effectively reduces the size of solder balls between the package structures and the copper pillars and also effectively reduces the planar size and thickness of the overall structure. Further, the copper pillars can be formed through stencil printing so as to achieve high yield, fine pitch and high uniformity.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A stack package structure, comprising:
    a first substrate having a first surface with a die attach area and a peripheral area defined thereon and a second surface opposite to the first surface, wherein the die attach area has a plurality of die attach pads, and the peripheral area has a plurality of first conductive pads;
    a first insulating layer formed on the first surface of the first substrate and having a plurality of openings for exposing the die attach pads and the first conductive pads;
    a plurality of first conductive terminals and a plurality of second conductive terminals disposed on the first insulating layer and electrically connected to the die attach pads and the first conductive pads;
    a dielectric layer formed on the first insulating layer, the dielectric layer having a cavity corresponding in position to the die attach area to expose the first conductive terminals and a plurality of openings for exposing the second conductive terminals;
    a plurality of first copper pillars disposed on the second conductive terminals in the openings of the dielectric layer;
    a first semiconductor chip disposed in the cavity of the dielectric layer and electrically connected to the first conductive terminals;
    a plurality of first solder balls formed on the first copper pillars that are located proximately to the die attach area; and
    a first package structure disposed on and electrically connected to the first solder balls.

2. The stack package structure of claim 1, wherein the first package structure comprises a second substrate and a second semiconductor chip disposed on the second substrate in a flip-chip manner, and the second semiconductor chip is located between the second substrate and the dielectric layer.

3. The stack package structure of claim 2, further comprising: a plurality of second copper pillars formed respectively on the first copper pillars that are located distant from the die attach area; a plurality of second solder balls formed respectively on the second copper pillars; and a second package structure disposed on and electrically connected to the second solder balls.

4. The stack package structure of claim 3, wherein the second package structure comprises a third substrate and a third semiconductor chip disposed on the third substrate in a flip-chip manner, and the third substrate is located between the second substrate and the third semiconductor chip.

5. The stack package structure of claim 1, further comprising a plurality of second conductive pads formed on the second surface of the first substrate, and a second insulating layer formed on the second surface of the first substrate and having a plurality of openings for exposing the second conductive pads, respectively.

6. The stack package structure of claim 5, further comprising a plurality of conductive through holes penetrating the first and second surfaces of the first substrate and electrically connected to the die attach pads, the first conductive pads and the second conductive pads.

7. The stack package structure of claim 5, further comprising a plurality of solder bumps formed on the second conductive pads, respectively.

8. The stack package structure of claim 1, further comprising an underfill or an encapsulant formed between the first semiconductor chip and the first surface of the first substrate.

9. The stack package structure of claim 1, wherein the dielectric layer is made of a photosensitive material.

10. A fabrication method of a stack package structure, comprising the steps of:
    providing a first substrate having a first surface with a die attach area and a peripheral area defined thereon and a second surface opposite to the first surface, wherein the die attach area has a plurality of die attach pads, and the peripheral area has a plurality of first conductive pads;
    forming a first insulating layer on the first surface of the first substrate and forming a plurality of openings in the first insulating layer for exposing the die attach pads and the first conductive pads, respectively;
    forming on the first insulating layer a plurality of first conductive terminals and a plurality of second conductive terminals electrically connected to the die attach pads and the first conductive pads, respectively;
    forming a dielectric layer on the first insulating layer and forming in the dielectric layer a cavity corresponding in position to the die attach area to expose the first conductive terminals and a plurality of openings for exposing the second conductive terminals;
    forming a plurality of first copper pillars on the second conductive terminals in the openings of the dielectric layer, respectively;
    disposing a first semiconductor chip in the cavity of the dielectric layer and electrically connecting the first semiconductor chip and the first conductive terminals;
    forming a plurality of first solder balls respectively on the first copper pillars that are located proximate to the die attach area; and disposing and electrically connecting a first package structure to the first solder balls.

11. The fabrication method of claim 10, wherein the first package structure comprises a second substrate and a second semiconductor chip disposed on the second substrate in a flip-chip manner, and the second semiconductor chip is located between the second substrate and the dielectric layer.

12. The fabrication method of claim 11, further comprising: after forming the first copper pillars, forming a plurality of second copper pillars respectively on the first copper pillars that are located distant from the die attach area; and, after disposing the first package structure, forming a plurality of second solder balls respectively on the second copper pillars so as to dispose and electrically connect a second package structure to the second solder balls.

13. The fabrication method of claim 12, wherein the second package structure comprises a third substrate and a third semiconductor chip disposed on the third substrate in a flip-chip manner, and the third substrate is located between the second substrate and the third semiconductor chip.

14. The fabrication method of claim 12, wherein the second copper pillars are formed by stencil printing.

15. The fabrication method of claim 10, wherein the second surface of the first substrate has a plurality of second conductive pads, and the method further comprises forming a second insulating layer on the second surface of the first substrate and forming a plurality of openings in the second insulating layer for exposing the second conductive pads, respectively.

16. The fabrication method of claim 15, wherein the first substrate has a plurality of conductive through holes penetrating the first and second surfaces thereof and electrically connected to the die attach pads, the first conductive pads and the second conductive pads.

17. The fabrication method of claim 15, further comprising forming a plurality of solder bumps on the second conductive pads, respectively.

18. The fabrication method of claim 10, further comprising forming an underfill or an encapsulant between the first semiconductor chip and the first surface of the first substrate.

19. The fabrication method of claim 10, wherein the dielectric layer is made of a photosensitive material.

20. The fabrication method of claim 10, wherein the first copper pillars are formed by stencil printing.

* * * * *